Nov. 21, 1967 K. H. WITTIG 3,354,397

VOLTAGE-VARIABLE DIODE CAPACITANCE TUNABLE CIRCUIT FOR TELEVISION APPARATUS

Filed Feb. 12, 1964 3 Sheets-Sheet 1

INVENTOR
KARL HEINZ WITTIG
BY
OSTROLENK, FABER, GERB & SOFFEN
ATTORNEYS

INVENTOR
KARL HEINZ WITTIG

BY

OSTROLENK, FABER, GERB & SOFFEN

ATTORNEYS

Nov. 21, 1967 K. H. WITTIG 3,354,397

VOLTAGE-VARIABLE DIODE CAPACITANCE TUNABLE CIRCUIT FOR TELEVISION APPARATUS

Filed Feb. 12, 1964 3 Sheets-Sheet 3

INVENTOR.
KARL HEINZ WITTIG

BY

OSTROLENK, FABER, GERB & SOFFEN

ATTORNEYS

United States Patent Office 3,354,397
Patented Nov. 21, 1967

3,354,397

VOLTAGE VARIABLE DIODE CAPACITANCE TUNABLE CIRCUIT FOR TELEVISION APPARATUS

Karl Heinz Wittig, Los Angeles, Calif., assignor to Standard Kollsman Industries, Inc., Melrose Park, Ill., a corporation of Illinois Filed Feb. 12, 1964, Ser. No. 344,317
21 Claims. (Cl. 325—459)

ABSTRACT OF THE DISCLOSURE

A tunable circuit for a radio receiver, such as a television tuner, wherein the tunable circuits utilize voltage controlled diode capacitors for both resonant frequency tuning, and band switching the operation of the tuned circuit between predetermined frequency ranges.

This invention relates to tuning systems for tuning the input circuitry of a radio receiver to the frequency of an incoming signal, by using a diode-capacitor of the voltage-controlled type as a source component to provide a variable parameter in a resonant tuning circuit.

The tuning system herein disclosed has general application, but, for the purpose of illustration, is shown as applied to several circuits in the input tuning end of a television receiver, in order to demonstrate the flexibility of the invention. Accordingly, as used herein and the accompanying claims, the term "radio receiver" is intended to refer to all such apparatus utilizing such a tuning system, and is inclusive of television receivers.

One object of the invention is to provide a tuning circuit which may be tuned to resonance by varying the reverse voltage bias on a voltage-variable capacitor which consists of a semi-conductor rectifier.

Another object of the invention is to provide a tuning system in which several co-operating tunable circuits may be individually and selectively biased, so proper tracking can be established when the several circuits are jointly operated from a common biasing control.

A television receiver, and certain other conventional radio receivers, utilizes four tuning circuits at the input end of the receiver for tuning to a selected incoming frequency signal and for developing a local operating frequency. These four tuning circuits include an input tunable circuit for the antenna, two inductively coupled interstage circuits to a mixer, and one oscillator tuned circuit to feed into the mixer locally, to develop a reduced local or intermediate frequency from the mixer for further amplification and treatment in the receiver.

In present conventional television receivers, where several channels are available to the user, the receiver input circuit must be tuned to the frequency of the selected channel. The main present conventional system employed for tuning-in a selected channel, involves a switching operation by a manually operable switch, which serves to connect a predesigned inductance coil into circuit with a single common variable capacitor to establish a resonance or tuned condition at the frequency corresponding to that of the channel selected.

The large amount of switching done with a television tuner switch imposes a heavy burden on the switch contacts. In time, the switch contacts wear, and introduce changes in the resistance parameters in the circuits to which the switch is operated.

By utilizing the variable-capacitance characteristics of a voltage-controlled variable-capacitor diode, many mechanical switching operations can be eliminated by utilizing the variable voltage type of control for biasing the diode capacitor to vary the value of the capacitance when that parameter of the diode capacitor is to be utilized.

One object of the invention is to provide a tuning circuit in which the unilateral diode conducting function or parameter is utilized in one function of tuning control of the circuit, and in which the capacitance parameter is utilized in a reverse function of the device in the tuning circuit.

Generally, in accordance with the invention, each individual circuit that is to be tuned contains an inductance element and a voltage-variable capacitor-diode. A voltage divider circuit is provided to impose a variable bias voltage on the capacitor-diode to vary the capacitance parameter to a value necessary to establish resonance in that circuit at the frequency for which the circuit is to be made resonant for the tuning operation.

Where a superheterodyning operation is employed, a local oscillator frequency is combined with the incoming frequency in a mixer from which the selected output represents, usually, the difference frequency between the input frequency and the oscillator frequency. In such operations, the several related tuned circuits, that were previously referred to, above, are simultaneously controlled by applying a common bias voltage change from a common control voltage source, such as a voltage-divider or potentiometer, to a diode-capacitor component in each circuit, to establish tracking control of the several tuned circuits so they will all respond properly and correspondingly to each separate frequency selected in the first tuned circuit that selects and receives the incoming signal.

As a further utilization of the variable capacitor diode within the philosophy of this invention, suitable circuitry is provided to serve as band selectors, that is, a band covering several TV channels. Thus, several channels are within range of selection of tuning by means of a single coil and a single variable capacitor. Such range of tuning is possible according to the range of capacitance available in response to the bias by which the capacitor-diode may be controlled.

Thus, within the scope of the invention, a band switching operation is controlled by operating a variable capacitor-diode according to its one function or the other, either as capacitors or as diodes, by first controlling the polarity of the impressed bias voltage, and then, if used as a capacitor, by varying the value of the capacitance parameter in order to achieve tuning, by varying the value of the impressed bias voltage.

The manner in which the circuits are arranged and controlled, and the manner in which they are combined for co-operative functioning to establish the desired tuning operations, are described in more detail in the following specification, taken in connection with the accompanying drawings, in which FIGURE 1 is a simple diagram of a circuit showing the basic tuning principle of this invention, as employed in a single resonant circuit;

FIGURE 2 shows a simple diagrammatic representation of four simple circuits that are co-operatively combined within a tuner for a receiver, and include FIGURE 2(*a*) as the incoming circuit, FIGURE 2(*b*) as the primary tuned circuit of an inductively coupled interstage circuit, with circuit FIGURE 2(*c*) representing the secondary of the tuned circuit as it feeds into a transistor as a mixer and FIGURE 2(*d*) showing a simple diagram of a transistor oscillator whose output will be fed to the mixer transistor in FIGURE 2(*c*);

Figures 7, 8:
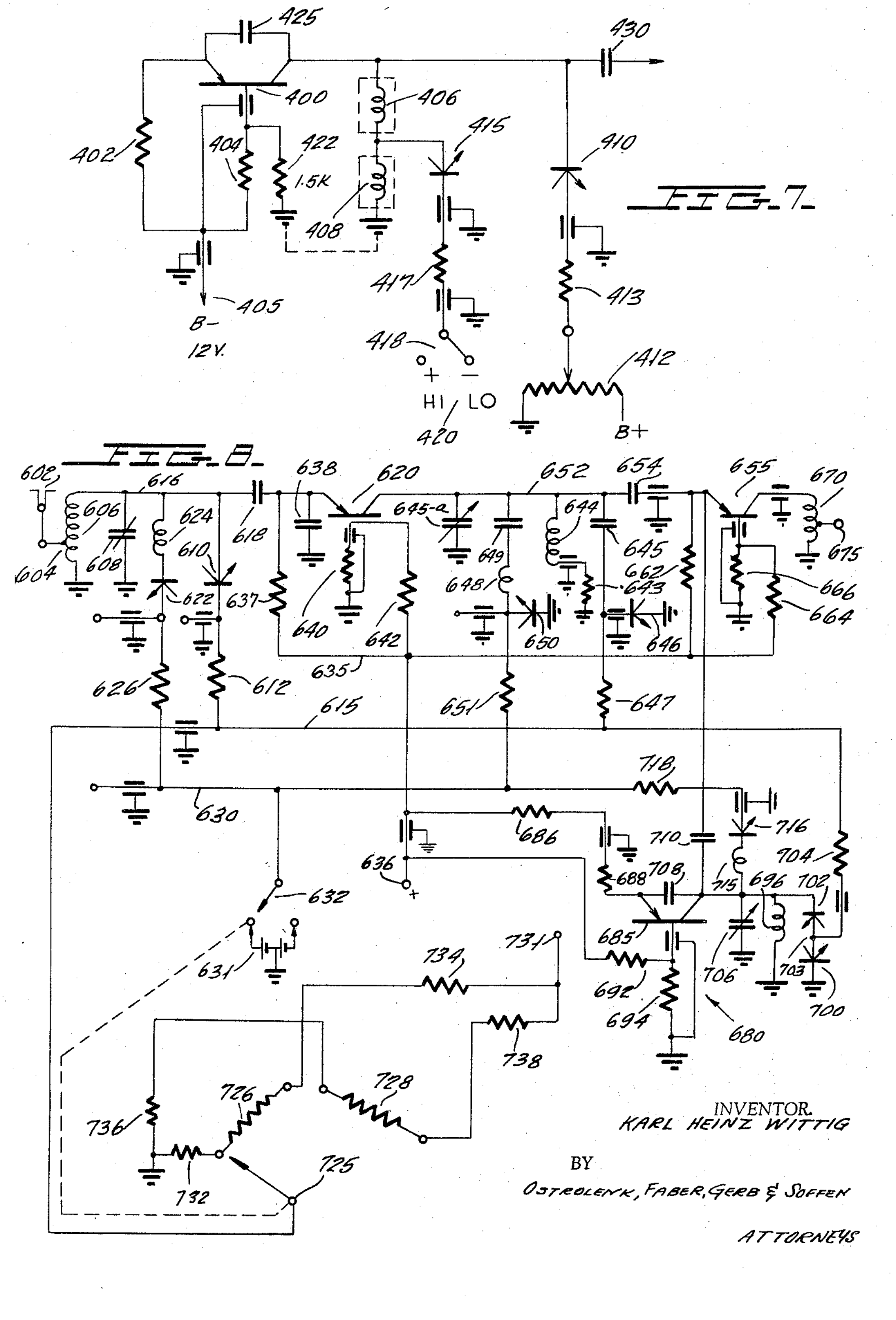
FIGURE 7 is a schematic diagram of the local oscillator circuit for developing the local frequency to be supplied to the mixer.

and FIGURE 8 is a simplified schematic diagram of a solid state transistor type television tuner, embodying various features of the circuitry shown in the preceding figures.

By utilizing these circuitry arrangements, the invention provides a system that is essentially a solid-state tuning and switching system. It has many advantages. Contact problems are eliminated. The physical size of the tuner can be reduced considerably. The tuner can be mounted anywhere on the chassis. In fact, since only direct-current voltages are involved in the tuning and switching process, by changing the bias on the diode-capacitors, the control device, viewed as a channel selector control, can be physically separated from other parts of the tuner. Only non-critical direct-current wiring would be needed between the two separated units.

Other advantages and features will be noted and referred to in the course of the description of the circuitry in the following specification.

Figures 1, 2, 3, 4:
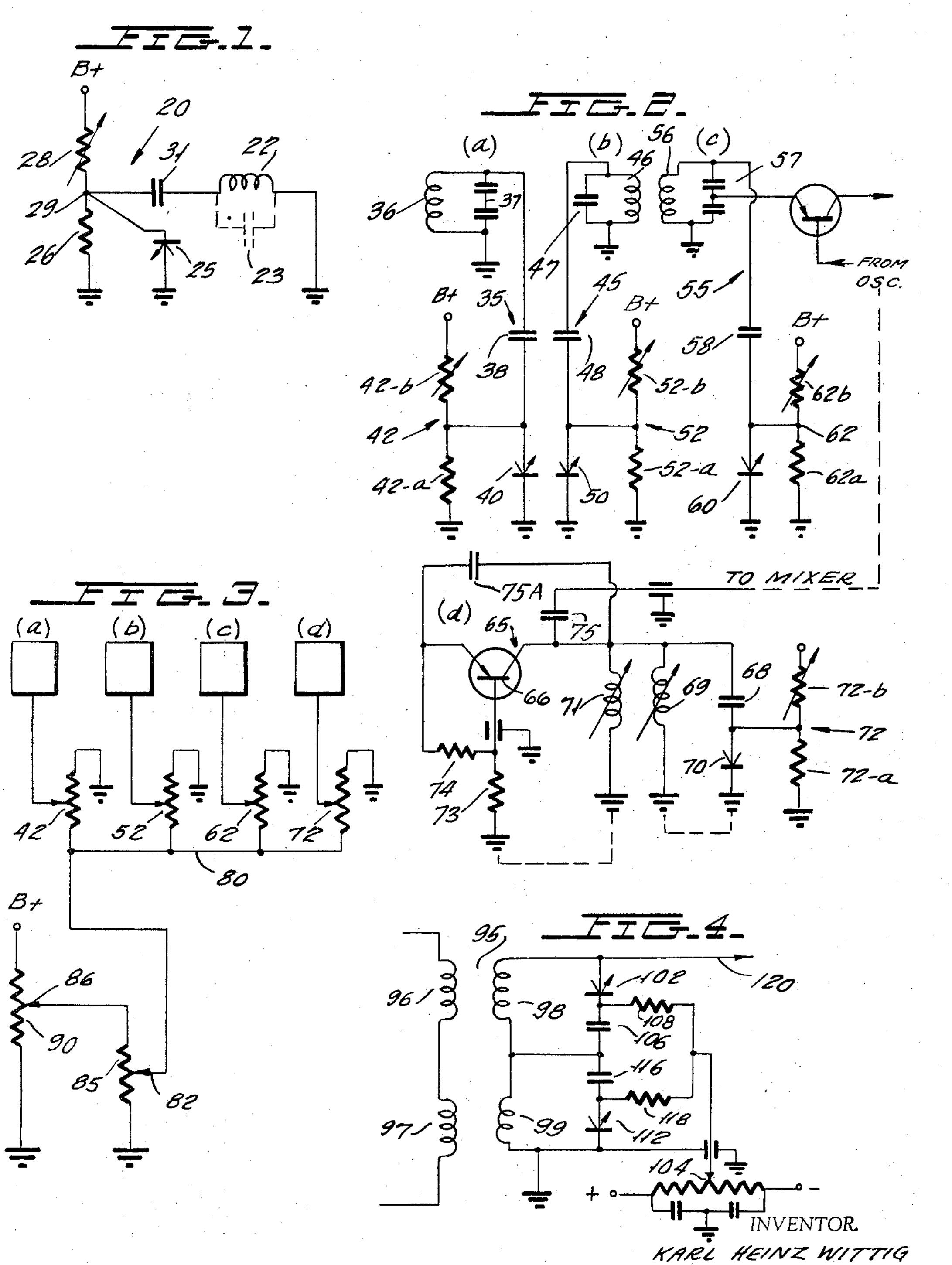
FIGURE 3 is a schematic block diagram representing a further extension of the circuitry in FIGURE 2, and shows the individual biasing arrangements for each of the tuned circuits, with a common biasing arrangement for controlling all of the tuned circuits simultaneously to establish both tracking and fine tuning adjustment at any selected channel frequency.
FIGURE 4 is a simplified diagram of a circuit in which a band switching operation is accomplished, according to this invention, by the polarity of an impressed biasing voltage, and in which the tuning is then accomplished by varying the voltage within the available range of the bias voltage at the polarity first established.

As shown in FIGURE 1, the basic circuit 20 is shown as comprising an inductance element 22 with distributed capacity 23, and a variable-voltage diode-capacitor 25 controllable by a bias of forward voltage polarity to act as a diode, or a bias of reverse polarity to assume a capacitance value that will establish parallel resonance between the inductance 22 and the capacitor 25. The bias voltage to bias the diode-capacitor 25 as a capacitor is derived from a variable voltage-divider circuit, including a fixed resistor 26 and a variable resistor 28, energized from a suitable DC or battery source labelled B plus. Adjustment of the variable resistor 28 changes the voltage of the junction point 29 to control the bias voltage on the diode-capacitor 25 to vary the effective capacitance of the diodes-capacitor 25. A blocking capacitor 31 keeps the direct current out of the inductance element 22.

As the bias on the diode-capacitor 25 is varied, its capacitance value varies, and the effective resonance tuning frequency between the diode-capacitor 25 and the inductance 22 correspondingly varies.

No input signal is indicated in FIGURE 1 to establish resonance in the resonant circuit. At this point, only the manner in which the bias is established on the diode capacitor is here shown, to show how the capacitance value is varied, which consequently will change the resonance condition that will determine the resonance frequency.

In conventional superheterodyne radio receivers, a selected external input signal of selected frequency is mixed with a local signal from a local oscillator that generates a selected variable frequency, and the two frequencies, so mixed in a local mixer, provide a difference frequency which is then utilized as the carrier for the intelligence originally carried on the incoming carrier signal.

The same type of a heterodyning circuitry is employed in the conventional television receiver, and for the purpose of illustration herein, the tuning circuitry up to the mixer is shown in FIGURE 2 in four individual tuning circuits labeled (*a*), (*b*), (*c*), and (*d*), the various usual coupling elements being here omitted. The circuit in FIGURE 2(*a*) represents the tuning circuit in the input receiving circuit, and is substantially similar to that shown in FIGURE 1. For the purpose of the present description, that circuit 35 in FIGURE 2(*a*) comprises an inductance element 36 with a certain amount of bridging capacitance 37, further bridged by an isolating capacitor 38 and a control diode-capacitor 40. Bias voltage for the control diode-capacitor 40 is derived from a voltage-divider circuit 42, similar to that shown in FIGURE 1, with resistors **42–*a* and 42–*b***.

In FIGURE 2(*b*), a similar circuit 45 is shown, that may be taken to represent, for example, the circuit associated with the primary or input winding of a coupling or band-pass transformer between the input circuit and the mixer. This circuit 45 includes elements similar to those in circuit 35, and comprises the primary 46 with some bridging capacitance 47 and a further bridging circuit including the isolating capacitor 48 and the associated control diode-capacitor 50. The bias voltage source is indicated by the voltage-dividing bias circuit 52 including resistors **52–*a* and 52–*b***.

The secondary or output winding of the coupling or band-pass transformer of the interstage from the input to the mixer, is shown in FIGURE 2(*c*). The secondary winding 56 is bridged by capacitance 57, and is further bridged by the circuit including an isolating capacitor 58 and a control diode-capacitor 60 which receives its bias voltage from a voltage-dividing bias circuit 62, containing resistors **62–*a* and 62–*b***.

To complete the arrangement of the individual circuits in FIGURE 2, the circuitry in FIGURE 2(*d*) shows, in simple schematic form, a transistor oscillator circuit 65. The oscillator circuit includes a transistor 66 whose output collector feeds into a tank circuit including an inductance element 69 and a control diode-capacitor 70 that is provided with a bias voltage from a voltage-divider circuit 72, with resistors **72–*a* and 72–*b*, indicated in the previous figures. The inductance 69 and the control diode-capacitor 70 will constitute a parallel resonance circuit depending upon the capacitance value of the diode-capacitor 70 as controlled by the bias voltage. A tickler coil 71, inductively related to the inductance coil 69 of the tank circuit, provides a feedback voltage through D.C. blocking capacitor 75A to the emitter of the oscillator transistor 66. The tank inductance 69 and the tickler coil 71 are shown variable or adjustable, as is the control or variable resistor 72–*b* in the voltage-divider circuit 72, to indicate flexibility of adjustment available for controlling the oscillator to any desired frequency. Thereafter, of course, the bias voltage on the control diode-capacitor 70 will control the tank circuit to correspondingly vary the resonance frequency of the tank circuit. The tank frequency is then supplied through a coupling capacitor 75** to the mixer shown in FIGURE 2(*c*), in order to derive the difference or intermediate frequency for transmission to the subsequent stages of the amplifier in the receiver. As in the previous circuits, the DC bias voltage for the control diode-capacitor 70 is kept out of the tank coil 69 by a blocking condenser 68.

In order to provide for tracking, in the several circuits shown in FIGURE 2, which will be similarly appropriate in any other system in which tracking must be established and maintained between related circuits, relative to a basic control frequency, such as the incoming signal frequency in a receiver, a common control system may be employed as illustrated schematically and functionally in the diagram of FIGURE 3.

As shown in FIGURE 3, the functions of the individual circuits in FIGURE 2 are represented by the blocks identified by the same respective letters (*a*), (*b*), (*c*) and (*d*), representing the input circuit, the two coupling circuits and the oscillator circuit. The bias controls for those four circuits are represented by the four voltage-divider circuits 42, 52, 62, and 72, corresponding to the similarly numbered voltage-divider circuits in the individual tuning circuits of FIGURE 2.

The four bias voltage circuits 42, 52, 62, and 72 in FIGURE 3 are fed from a common bus 80 which is connected to the movable tap 82 of a fine-tuning potentiometer 85, which in turn is energized from the movable tap 86 of a main potentiometer 90.

In accordance with the principle of the present invention, the potentiometer 90 provides the large steps suitable for providing large increments of bias voltage to ultimately reach the related control diode-capacitors, for tuning those related circuits to a selected incoming frequency. The fine-tuning potentiometer 85 then serves for any fine re-tuning adjustments that may be necessary under varying ambient conditions.

Switching by voltage increments is necessarily limited to a limited number of steps. In order to cover the wide range that spans the many channels available for television selection, the entire spectrum of selection may be divided into two or more bands, and band switching may be employed to enable the present invention to be utilized over the entire band spectrum in the television receiver selection. This method of band switching is an important feature of this invention.

One simple arrangement for band switching is shown in the diagram in FIGURE 4. The transformer 95 is shown provided with two series-connected primary coils 96 and 97 with correspondingly related secondary coils 98 and 99. The secondary winding 98 is to function with a control diode-capacitor 102 in parallel resonance for the frequencies within a certain band, as controlled by the bias voltage to be applied from a variable DC supply source 104. A blocking condenser 106 keeps the DC out of the secondary winding 98. A high value resistor 108, of the order of four megohms, for example, holds any bias current to a very low value.

In similar manner, the secondary winding 99 cooperates with a control diode-capacitor 112, which is supplied from the same DC source 104, with a bias voltage of the same polarity as applied to the diode-capacitor 102, through a limiting resistor 118. A blocking condenser 116 is utilized in this parallel network to keep DC current out of the secondary winding 99.

In this arrangement shown in FIGURE 4, the source of bias voltage 104 is arranged so that the bias voltage may be varied not only in amplitude, but also in polarity. That control is an important feature of this band switching arrangement. For one polarity, one control diode-capacitor, either 102 or 112, will be forward-biased, to function with its blocking condenser to provide a susbtantial alternating-current short circuit across its associated secondary coil. The other diode-capacitor will be reverse biased by that polarity, and will therefore function as a capacitor, whereupon a parallel resonance condition can be established at the proper frequency, as controlled by the amplitude of the tuning voltage at that polarity as derived from the voltage source 104.

Thus, the polarity of the bias voltage from the source 104 determines which of the secondary coils 98 or 99 will be affected with its related circuitry to establish a resonance condition. That circuit will then be available for resonance over its designed band so long as the bias voltage is of the same polarity. The variation in the value or amplitude of the bias voltage will control the value of capacitance and therefore the resonance setting of that circuit to establish the resonance condition for the selected frequency which it is desired to bring into the receiver.

When a desired frequency is within the other band of frequencies, controlled by the other secondary coil, the bias voltage selector 104 is shifted to the opposite polarity which thereupon causes a short circuit for the band that is not wanted, and establishes resonance control of the coil which will transmit the frequency band in which the desired frequency is located.

The selected frequency thus brought into the receiver then constitutes the output of this circuit onto the output conductor 120, leading to the coupling stage to the mixer, for heterodyning with the local oscillator frequency, in order to obtain a working intermediate frequency within the receiver.

Figure 5:
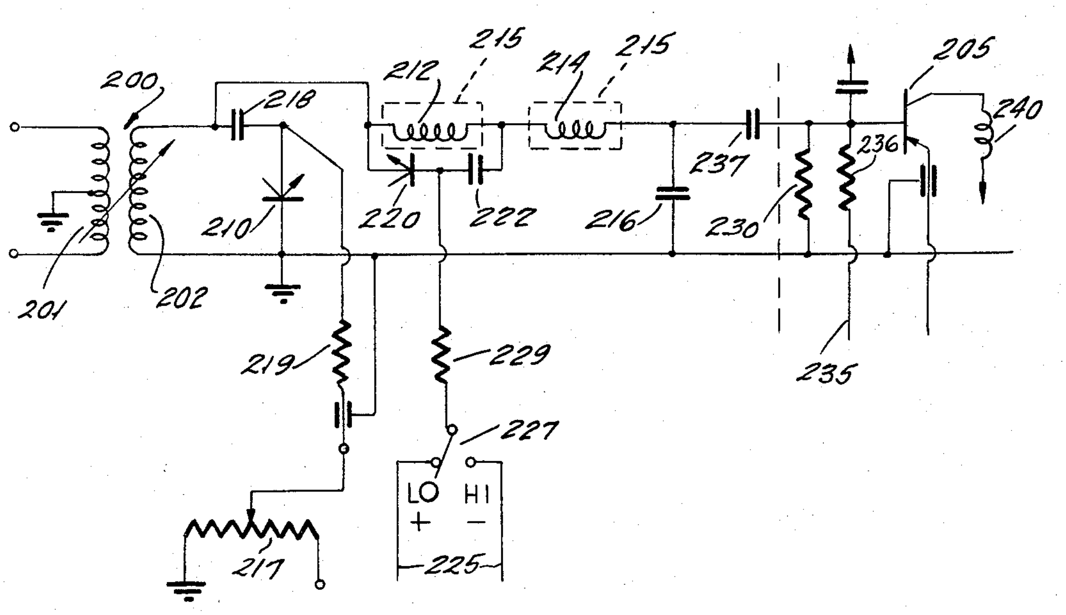
FIGURE 5 shows a simple diagram of an alternative arrangement of the circuitry for tuning the input radio frequency circuit, and illustrates the utilization of a pi type network within the radio frequency range.

In FIGURE 5 is shown an alternative arrangement of a band-switching circuitry for the input circuit, preceding the first amplifier stage.

An incoming signal from the antenna and line is fed into a 300-ohm balanced primary 201 of a variable input transformer 200, through which the signal is inductively transferred to the secondary winding 202, which has a relatively high impedance. A tuned circuit and matching network connects the secondary winding 202 to the input of a transistor amplifier 205 of the radio-frequency stage.

The tuned circuit and matching network between secondary 202 and transistor 205 consists of a shunt control diode-capacitor 210, two series connected inductors 212 and 214, and a shunt capacitor 216, in the form of a pi network. The two inductors 212 and 214 are separated or shielded by shields 215 to prevent mutual inductive coupling that would produce shorted turns effect when one inductor is shorted out. A capacitor 218 serves as a blocking capacitor to keep the DC reverse bias voltage for the diode-capacitor 210 out of transformer secondary 202. That bias voltage for the voltage-controlled diode-capacitor 210 is derived from a voltage source 217 through a limiting resistor 219 of the order of 4 megohms. Variable adjustment of that bias voltage 217 varies the capacitance of the control diode-capacitor 210, as previously described for FIGURE 1, and provides the single tuning control.

The pi series inductance 212 is bridged by a second control diode-capacitor 220 and a capacitor 222 which serves as a blocking capacitor to keep DC reverse bias voltage for the control diode-capacitor 220 out of the circuit that would go through the inductance 212 to the secondary 202 of transformer 200. The bias voltage for diode-capacitor 220 is illustrated as derived from a voltage source 225 through a two-position switch 227 which permits one polarity or the other of the source 225 to be selectively applied to bias the diode-capacitor 220 either in forward direction as a diode or in reverse direction as a capacitor, through a limiting resistor 229.

When switch 227 is in low position, on the positive terminal of voltage source 225, diode-capacitor 220 is reversely biased and acts as a capacitor. Both inductors 212 and 214 are then effective in the series circuit of the pi connection. Tuning is established by the variation of the voltage applied from source 217 to the diode capacitor 210, to vary the capacitance of 210 to tune to the secondary 202.

When switch 227 is switched to negative terminal of source 225, diode-capacitor 220 is biased forward and with blocking capacitor 222 serves to short-circuit inductor 212, thus leaving only inductor 214 as the series leg of the pi network consisting of capacitor 210, inductor 214 and capacitor 216. Variation of the voltage from source 217 on diode-capacitor 210 still serves to tune the diode-capacitor 210 to the secondary winding 202 for selecting an incoming frequency.

Thus, the control diode-capacitor 220 may be controlled by the polarity switch 227 to short-circuit inductor 212 or to leave that inductor in circuit, thereby to provide for simple group channel switching, while the voltage applied to the diode-capacitor 210 controls the tuning by adjusting the capacitance parameters.

The output signal from the pi network, as developed across the capacitor 216, then goes to a load resistor 230 across which a voltage signal is developed to provide an input signal to the base of the transistor amplifier 205. A bias circuit 235 containing a limiting resistor 236 provides appropriate bias for the base of the amplifier 205 and may be utilized to supply a control voltage also, such as automatic gain control, to the amplifier.

A blocking condenser 237 keeps direct current from the biasing circuit 235 from entering the transformer secondary 202. The output from transistor 205 at the collector electrode is fed to a collector output impedance 240, shown here to indicate a component in a subsequent stage.

Figure 6:
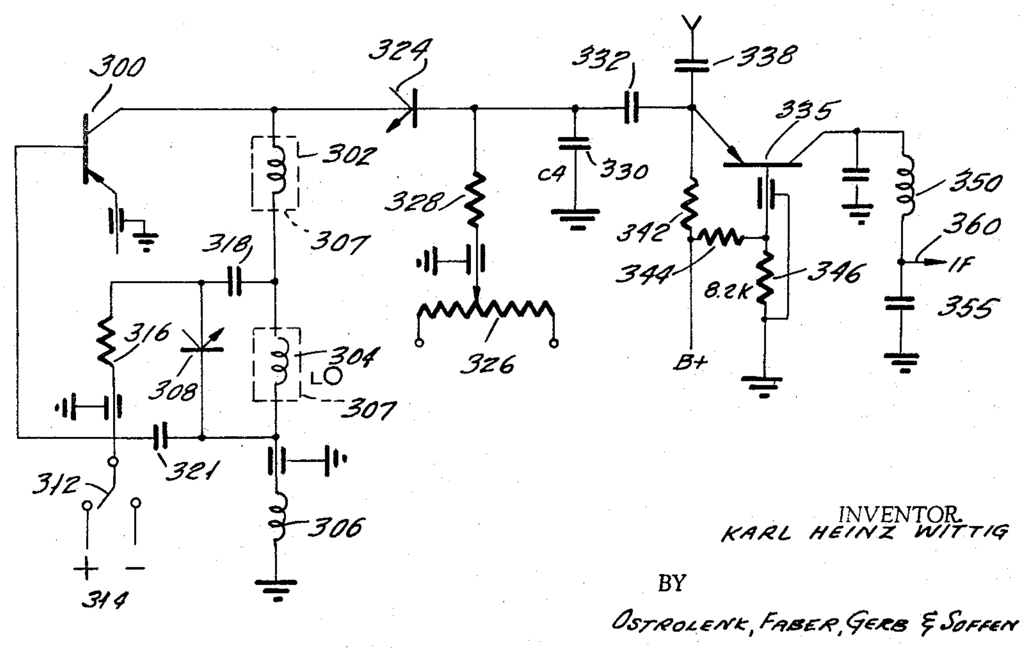
FIGURE 6 is a schematic diagram of the interstage connection between the radio frequency stage and the mixer transistor.

In FIGURE 6 is shown a schematic circuit arrangement for an interstage between the radio frequency stage of FIGURE 5 and the mixer or converter from which the operating intermediate frequency of the receiver is to be derived. This arrangement is similar to that in FIGURE 5, in that the circuit of FIGURE 6 also employs two series inductances to permit switching from high to low band-pass action.

The circuit in FIGURE 6 includes a transistor 300 (which may be transistor 205 of FIGURE 5), whose collector electrode feeds into an output circuit including an inductance 302, an inductance 304 and a radio-frequency choke 306. Inductances 302 and 304 are spaced or appropriately shielded as by shielding 307. The inductance 304 may be short-circuited, when desired, by a control diode-capacitor 308, which is arranged to be suitably polarized to accomplish its function by a band-pass selector switch 312 from a voltage source 314 through a resistor 316. When switch 312 is in high-pass position, it puts positive potential on control diode-capacitor 308 to bias said diode-capacitor forward. The diode-capacitor 308 and a blocking capacitor 318 then short-circuit the inductance 304. A capacitor 321 provides a control bias for the base electrode of transistor 300.

The other elements of the tuning circuit in the interstage in FIGURE 6 include a tuning control diode-capacitor 324, a voltage-tuning circuit including a variable-voltage and polarity source 326 with a limiting resistor 328, a fixed capacitor 330, and a blocking capacitor 332, leading to an input emitter electrode of an output transistor 335 serving as a mixer to develop, as its output, an intermediate frequency signal voltage. A capacitor 338 serves to inject a local oscillator voltage from an oscillator circuit shown in FIGURE 7.

The bias voltages for the mixer transistor 335 are established from a voltage source indicated by B-plus, through an emitter resistor 342, a dropping resistor 344 and a base resistor 346.

The mixer transistor 335 feeds its output from its collector electrode to a fixed tuned circuit including an inductance 350 and a capacitor 355 tuned to the operating intermediate frequency of the receiver. Such intermediate frequency is taken off at the junction 360 between the inductance 350 and the capacitor 355 for delivery to the intermediate frequency stage.

FIGURE 7 shows the schematic arrangement for the oscillator circuit, for switching from low-channel to high-channel conditions. A transistor 400 is provided with a limiting emitter resistor 402 and a limiting base bias resistor 404, both connected to the B-negative terminal of a bias voltage source 405. The collector output terminal of the transistor feeds into a tank circuit including an inductance and an adjustable diode-capacitance. The inductance of the tank consists of two sections 406 and 408, and the diode-capacitance 410 is connected in a parallel circuit to tune the tank circuit to resonance for oscillation frequency, either for the low channel frequency range or for the high channel range. Tuning control voltage for the tuning diode-capacitor 410 is derived from a voltage supply 412 through a limiting resistor 413.

For low channel range operation, both inductance elements 406 and 408 are kept in circuit.

For high channel range operation, the inductance section 408 will be shorted out by a control diode 415, in response to forward biasing polarity from a voltage source 420 through suitable switching means 418 and a limiting resistor 417.

The tuned circuit including the inductance sections 406 and 408 in the output of the transistor 400 is completed through a resistor 422. This feed-back voltage from output to input of the transistor is provided through a capacitor 425. A coupling capacitor 430 couples the oscillator output to an appropriate terminal of the mixer.

In FIGURE 8 is shown a schematic circuit for a television tuner, combining certain of the features of the necessary circuitry from the preceding figures and devoted to appropriate sections of the operating total circuit.

As shown in FIGURE 8, an antenna 602 provides an input signal to an input terminal 604 to an inductance coupler 606, which provides a step-up voltage at the freequency of a selected incoming signal at the lower end of the low channel group. A trimmer capacitor 608 balances out any undesired distributed capacity of the coupling coil 606. Selective tuning through the low channel group, in accordance with the principles of the present invention, is achieved through a control diode-capacitor 610 and a resistor 612 connected to the tuning bus conductor 615. The opposed terminal of control diode capacitor is connected to a coupling conductor 616 connected between the input inductance antenna coupling coil 606 and a coupling capacitor 618 which couples the antenna coil 606 to a radio frequency transistor amplifier 620.

A switching circuit for switching the circuitry from the low channel group setting to the setting for the group including higher-numbered channels, includes a diode-capacitor 622 with an inductance coil 624 and a resistor 626, connected from a switching bus 630 to the coupling conductor 616. The switching bus 630 receives its biasing polarity from a bias voltage source 631, through a hi-low transfer switch 632.

The radio frequency transistor amplifier 620 is provided with emitter bias voltage from a bias voltage supply conductor 635 through a filter including a resistor 637 and a capacitor 638. The base of the transistor amplifier 620 is grounded through a stabilizing resistor 640, and is connected to said bias voltage supply conductor 635 through a base biasing resistor 642. The bias voltage supply conductor 635 is energized from a positive terminal 636, of about fifteen volts, for example, from the tuner power supply of the receiver. The output collector electrode of transistor 620 is connected to a tank load circuit including an inductance 644 and a capacitor 645. The inductor 644 is grounded through a resistor 643, and the tank capacitor 645 is grounded through a diode capacitor 646 that serves as a tuning capacitor as controlled from the tuning bus 615 through a limiting resistor 647. A trimmer capacitor 645–*a* aids in initial tank tuning setting.

For operation in the high channel range, an inductor 648 is connected between the collector electrode of transistor 620 and ground through a DC blocking condenser 649 and a control diode capacitor 650. The operation of the diode-capacitor 650 is controlled from the switching bus 630 through a limiting resistor 651.

The output from the collector electrode of transistor 620 is fed through an output conductor 652 and a coupling capacitor 654 to the emitter of a mixer transistor 655.

The mixer transistor 655 is provided with bias voltages from said bias voltage supply conductor 635 through an emitter resistor 662 and through a base resistor 664. The base of the transistor is otherwise grounded through a stabilizing resistor 666. The output from the mixer transistor 655 is fed to a load coil 670 with a suitable tap 672 as an auto-transformer from which the output from the mixer 655 is fed to an intermediate frequency section 675 of the receiver, to provide the intermediate or difference frequency, developed between the input frequency, from the front end through the radio frequency transistor 620 and the local oscillator frequency, generated by a local oscillator 680.

The local oscillator 680 comprises a transistor 685, with a voltage bias circuit to the emitter including a resistor 686 and a resistor 688; a bias circuit to the base including a bias resistor 692; a stabilizing circuit to the base including a gorunded resistor 694; a collector load circuit including a grounded inductance tank coil 696 with a tuning tank capacitor circuit arranged to include two back-to-back control diode-capacitors 700 and 702 to be tuned according to the position of the channel selector in low channel or in high channel position. The junction 703 between the two diode-capacitors 700 and 702 is excited from the tuning bus 615 through a limiting resistor 704, and thus provides simultaneous tuning for either of the two diode-capacitors 700 and 702, depending upon which is switched to capacitor condition by the polarity on the switching bus 630 from the bias voltage source 631.

A trimming capacitor 706 is provided for initial tuning of the tank coil 696, and a voltage feed-back capacitor 708 is connected between input and output terminals of transistor 685.

A coupling capacitor 710 feeds the output frequency of the oscillator 680 from the collector terminal of transistor 685 to the input emitter electrode of the mixer transistor 655, previously referred to.

The tuning tank circuit for the oscillator 680 is arranged to be changed according to the setting of the tuner for low or for high channel selection. For low channel setting, the tuning tank circuit includes the inductor 696, already mentioned, and a second inductor 715 coupled to the switching bus 630 through a control diode-capacitor 716 and a limiting resistor 718. The control diode-capacitor serves as a switching device to add the inductance of the inductor 715 to that of tank inductor 696 for high channel position of the tuner channel selector 725.

The channel selector 725 is shown schematically and functionally as consisting generally of two potentiometer resistors 726 and 728, each connected between a constant voltage terminal 731 and ground. The constant voltage terminal 731 represents a fixed DC potential point of the power supply of the receiver. Appropriate limiting resistors 732 and 734 are disposed between the respective terminals of the potentiometer resistor 726 and ground at one terminal and the potential terminal 731 at the other terminal. Similarly, a limiting resistor 736 is disposed between potentiometer 728 and ground, and a limiting resistor 738 between potentiometer and potential terminal 731.

As the channel selector 725 is adjustably moved on the potentiometer 726 to select a channel from the low-channel group, channel 2 to channel 6, a corresponding tuning potential from the potentiometer 726 is applied to the tuning conductor 615, and thence onto diode-capacitors 610, 646, 700 and 702.

When the selection of a channel is to be made in the range from channel 7 to channel 13, the channel selector 725 is shifted to potentiometer 728, to provide tuning voltage to the tuning bus 615 for the same diode-capacitors 610, 646, 700 and 702.

When the channel selector 725 is shifted from low-channel range to high-channel range, or vice versa, the bias switch 632 is also shifted to corresponding position to provide the appropriate voltage polarity to the switching bus 630 to bias the control diode-capacitors 622, 650 and 716, to low-resistance condition or to small capacitance value which may be varied by variable applied voltage for tuning.

Thus, the bias-controlled diode-capacitors may be used with the bias controls and the channel selector to achieve channel grouping and individual channel selection and tuning within each group.

Variations in the circuitry may be made without departing from the spirit and scope of the invention, as defined in the claims.

The embodiments of the invention in which an exclusive privilege or property is claimed are defined as follows:

1. In a tuner for a radio receiver having an interstage coupling, a band-switching system comprising a coupling transformer having (a) first and second primary winding sections connected in series, and (b) first and second secondary winding sections connected in series, with the junction of said first and second secondary winding sections providing a mid-point tap;

a first voltage-variable diode capacitor and isolating capacitor bridging said first secondary winding section, a second voltage-variable diode capacitor and isolating capacitor bridging said second secondary winding section; said first voltage variable diode capacitor establishing a first tunable circuit with said first secondary winding section, and said second voltage variable diode capacitor establishing a second tunable circuit with said second secondary winding section, with said first and second isolating capacitors circuit connected in common to the mid-point tap of said first and second secondary winding sections; and a control bias voltage source circuit connected to both the junctions between said first voltage-variable diode-capacitor and said first isolating capacitor; and said second voltage-variable diode capacitor and said second isolating capacitor.

2. In a tuner, as in claim 1, a band-switching system as there specified, in which the control bias voltage to each of said junctions is applied through a limiting resistor.

3. A band-switching system, in a tuner, as in claim 1, including means for selectively changing the polarity of the control bias voltage, in order thereby to selectively bias control a desired one of the voltage-variable diode-capacitors in a direction to be conductive and to thereby short-circuit its related transformer secondary section.

4. A tuner for a radio receiver having an input stage, at least one intermediate coupled stage and a mixer stage, each stage including a tuned circuit; and each stage circuit including an inductive element and a voltage-variable diode capacitor;

a variable-voltage source for each stage circuit; and means for applying a selected voltage from each said source to the voltage-variable diode-capacitor of the circuit that is related to each such source, in order to control the frequency at which each said tuned stage circuit will resonate, and band switching means for switching the tuning range of each of said tuned circuits between predetermined frequency ranges.

5. A tuner as set forth in claim 4, said band switching means including an additional voltage-variable diode capacitor, additional bias means therefor, and means for changing the polarity of said additional bias means such that said additional voltage-variable diode capacitor is switched between a forward bias and reverse bias condition to effect band switching operation.

6. In a tuner as in claim 5, said band switching means including an additional inductive element, said additional variable capacitor circuit connected to said additional inductive element, such that it acts to short said additional inductive element when in its forward bias condition and capacitively tune said additional inductive element when in said reverse bias condition.

7. A tuner for a radio receiver having an input stage, at least one intermediate coupled stage and a mixer stage, each stage including a tuned circuit, and each stage tuned circuit including an inductive element and a voltage-variable diode-capacitor to establish the resonant frequency of the stage, variable-voltage source means for said tuned circuits, and means for applying a selected voltage from said source means to the voltage-variable diode-capacitor of said tuned circuits, in order to controllingly tune the frequency at which each of said tuned stage circuits will resonate, each of said tuned circuits including an additional inductance means and an additional voltage-controllable diode element circuit connected thereto, a band switch voltage source means and means for applying a selected voltage from said band switch voltage source means to said additional voltage-controllable diode element, said band switch voltage source means characterized as having a first value for forward biasing said additional voltage-controllable diode-element to a unilateral diode appreciable conducting function, and a second value for reverse biasing said additional voltage-controllable diode-element to an appreciable blocking function, the selective presentment of said voltage values to said additional voltage-controllable diode element for the switching thereof between said appreciable conducting and appreciable blocking functions operable on said additional inductance means for band switching the tuning of its respective tuned stages between predetermined frequency ranges.

8. A tuner as claimed in claim 7 in which said tuned circuits include circuit elements operatively inter-related to define and locate the two frequency band-pass regions to overlap in part.

9. A tuner as set forth in claim 7, said variable voltage source means and band switch voltage source means physically displaced from said tuned stages, with the sole connection therebetween being direct current wiring.

10. A tuner as set forth in claim 7, said variable voltage source means being a common bus for simultaneously tuning each of said tuned stages, and said band switch voltage source means being a common bus for simultaneously band switching each of said tuned stages.

11. A tuner as set forth in claim 7, said additional voltage-variable diode-capacitor circuit connected across its respective additional inductance means, to thereby short said inductance means when forward biased to said appreciable conducting function, and effectively remove the additional inductance means from the tuned circuit.

12. A tuner as set forth in claim 7, at least one of said tuned circuits including a pi-network with said inductive element and additional inductance means series circuit connected; said tunable voltage-variable diode-capacitor being at one end of the series circuit, and another parallel capacitor being at the other end of the series circuit.

13. A tuner for a radio receiver having an input stage, at least one intermediate coupled stage and a mixer stage, each stage including a tuned circuit, and each stage tuned circuit including an inductive element and a voltage-variable diode-capacitor to establish the resonant frequency of the stage, variable-voltage source means for said tuned circuits, and means for applying a selected voltage from said source means to the voltage-variable diode-capacitor of said tuned circuits, in order to controllingly tune the frequency at which each of said tuned stage circuits will resonate, further including an interstage coupling, (a) first and second primary winding sections connected in series, and (b) first and second secondary winding sections connected in series, with the junction of said first and second secondary winding sections providing a mid-point tap; a first voltage variable diode capacitor and isolating capacitor bridging said first secondary winding section, a second voltage variable diode capacitor and isolating capacitor bridging said second secondary winding section; said first voltage variable diode capacitor establishing a first tunable circuit with said first secondary winding section, and said second voltage variable diode capacitor establishing a second tunable circuit with said second secondary winding section, with said first and second isolating capacitors circuit connected in common to the mid-point tap of said first and second secondary winding sections; and said variable voltage source means circuit connected to both the junctions between said first voltage-variable diode-capacitor and said first isolating capacitor; and said second voltage-variable diode-capacitor and said second isolating capacitor.

14. A tuner, as claimed in claim 13, wherein the control bias voltage to each of said junctions is applied through a limiting resistor.

15. A tuner, as claimed in claim 13, wherein the band-switching system includes means for changing the polarity of the control bias voltage provided by said variable voltage source means, in order thereby to control the function of a selected one of the voltage-variable diode-capacitors to be conductive and to short-circuit its related transformer secondary section.

16. A tuner for a radio receiver having an input stage, at least one intermediate coupled stage and a mixer stage, each stage including a tuned circuit including inductance means and a voltage variable diode-capacitor to establish the resonant frequency of the stage, a variable-voltage source means for said tuned circuits, and means for applying a selected voltage from said source means to the voltage-variable diode capacitor of said tuned circuits, in order to controllingly tune the frequency at which each of said tuned stage circuits will resonate, and band switching means having an additional voltage-controllable diode element for switching each of said tuned stage circuits between predetermined frequency ranges.

17. A tuner, as claimed in claim 16, in which said inductance means includes two inductance elements, and said band switching means includes means for short-circuiting one of said inductance elements, to change the operating frequency band of the tuned circuit.

18. A tuner, as claimed in claim 17, in which said short-circuiting means comprises a voltage-variable diode capacitor and means for applying forward bias polarity to said diode capacitor to cause it to serve as a low impedance element.

19. A tuner as claimed in claim 16 wherein said band switching means includes an additional voltage-variable diode capacitor, additional bias means therefor, and means for changing the polarity of said additional bias means such that said additional voltage-variable diode capacitor is switched between a forward bias and reverse bias condition to effect band switching operation.

20. A tuner as claimed in claim 19 wherein said band switching means includes an additional inductive element within the tuned circuit, said additional variable capacitor circuit connected to said additional inductive element, such that it acts to short said additional inductive element when in its forward bias condition and capacitively tune said additional inductive element when in said reverse bias condition.

21. In a radio receiver, at least one tunable stage operating with a voltage-controlled diode element circuit connected to an inductive element for resonant tuning to a selected frequency by a continuously variable reverse polarity voltage, the improvement comprising: an additional voltage controlled diode element, additional inductance means circuit connected thereto, and a forward-reverse voltage polarity source for selectively switching said additional voltage-controlled diode element between a reverse and forward conducting condition to selectively switch the operating frequency of the tunable stage between predetermined frequency bands.

No references cited.

KATHLEEN H. CLAFFY, *Primary Examiner.*

R. LINN, *Assistant Examiner.*